(12) United States Patent
Glezer et al.

(10) Patent No.: US 7,607,470 B2
(45) Date of Patent: Oct. 27, 2009

(54) SYNTHETIC JET HEAT PIPE THERMAL MANAGEMENT SYSTEM

(75) Inventors: Ari Glezer, Atlanta, GA (US);
Raghavendran Mahalingam, Austin, TX (US); Samuel Heffington, Austin, TX (US)

(73) Assignee: Nuventix, Inc., Austin, TX (US)

( * ) Notice: Subject to any disclaimer, the term of this patent is extended or adjusted under 35 U.S.C. 154(b) by 0 days.

(21) Appl. No.: 11/599,628

(22) Filed: Nov. 13, 2006

(65) Prior Publication Data

US 2007/0119575 A1    May 31, 2007

Related U.S. Application Data

(60) Provisional application No. 60/736,412, filed on Nov. 14, 2005.

(51) Int. Cl.
*H01L 23/467* (2006.01)
(52) U.S. Cl. ............... 165/121; 165/80.3; 165/104.33; 165/125
(58) Field of Classification Search ............ 165/80.3, 165/104.21, 104.33, 121, 125; 361/697, 361/700
See application file for complete search history.

(56) References Cited

U.S. PATENT DOCUMENTS

| | | | |
|---|---|---|---|
| 3,464,672 A | 9/1969 | Massa | |
| 4,031,171 A | 6/1977 | Asao et al. | |
| 4,170,244 A | 10/1979 | Bernaerts | |
| 4,238,425 A | 12/1980 | Matsuoka | |
| 4,257,224 A | 3/1981 | Wygnanski et al. | |
| 4,350,838 A | 9/1982 | Harrold | |
| 4,406,323 A | 9/1983 | Edelman | |
| 4,498,851 A | 2/1985 | Kolm et al. | |
| 4,501,319 A | 2/1985 | Edelman et al. | |
| 4,533,082 A | 8/1985 | Maehara et al. | |
| 4,590,399 A | 5/1986 | Roxlo et al. | |
| 4,590,970 A | 5/1986 | Mott | |
| 4,595,338 A | 6/1986 | Kolm et al. | |
| 4,664,345 A | 5/1987 | Lurz | |
| 4,667,877 A | 5/1987 | Yao et al. | |
| 4,693,201 A | 9/1987 | Williams et al. | |
| 4,697,116 A | 9/1987 | Nakamura et al. | |
| 4,697,769 A | 10/1987 | Blackwelder et al. | |
| 4,708,600 A | 11/1987 | AbuJudom, II et al. | |

(Continued)

FOREIGN PATENT DOCUMENTS

EP    0 385 090    1/1990

(Continued)

OTHER PUBLICATIONS

Chapter 6.6: Compact Ultrasonic Air Transducer; http://www.globalspec.com; Sep. 14, 2006; 11 pages.

(Continued)

*Primary Examiner*—Teresa J Walberg
(74) *Attorney, Agent, or Firm*—John A. Fortkort; Fortkort & Houston P.C.

(57) ABSTRACT

A thermal management system (201) is provided which comprises a first heat spreader (205) comprising a heat pipe material, a plurality of fins (217) disposed on said first heat spreader, and a synthetic jet actuator (209) adapted to direct a synthetic jet between at least a pair of said plurality of fins.

21 Claims, 8 Drawing Sheets

U.S. PATENT DOCUMENTS

| | | | |
|---|---|---|---|
| 4,727,930 A | 3/1988 | Bruckner et al. |
| 4,763,225 A | 8/1988 | Frenkel et al. |
| 4,780,062 A | 10/1988 | Yamada et al. |
| 4,802,642 A | 2/1989 | Mangiarotty |
| 4,923,000 A | 5/1990 | Nelson |
| 4,930,701 A | 6/1990 | Porter et al. |
| 4,930,705 A | 6/1990 | Broerman |
| 4,932,610 A | 6/1990 | Maestrello |
| 4,938,279 A | 7/1990 | Betker |
| 4,938,742 A | 7/1990 | Smits |
| 4,939,405 A | 7/1990 | Okuyama et al. |
| 4,941,398 A | 7/1990 | Morris et al. |
| RE33,448 E | 11/1990 | Bauer |
| 4,969,802 A | 11/1990 | Merrigan et al. |
| 4,976,311 A | 12/1990 | Kurzweg |
| 4,989,810 A | 2/1991 | Meier et al. |
| 5,008,582 A | 4/1991 | Tanuma et al. |
| 5,034,688 A | 7/1991 | Moulene et al. |
| 5,040,560 A | 8/1991 | Glezer et al. |
| 5,083,194 A | 1/1992 | Bartilson |
| 5,107,398 A | 4/1992 | Bailey |
| 5,137,079 A | 8/1992 | Anderson |
| 5,142,260 A | 8/1992 | House |
| 5,154,347 A | 10/1992 | Vijay |
| 5,156,306 A | 10/1992 | Perera |
| 5,165,243 A | 11/1992 | Bennett |
| 5,183,104 A | 2/1993 | Novotney |
| 5,190,099 A | 3/1993 | Mon |
| 5,199,640 A | 4/1993 | Ursic |
| 5,199,856 A | 4/1993 | Epstein et al. |
| 5,209,438 A | 5/1993 | Wygnanski |
| 5,226,597 A | 7/1993 | Ursic |
| 5,242,110 A | 9/1993 | Riley |
| 5,251,817 A | 10/1993 | Ursic |
| 5,303,555 A | 4/1994 | Chrysler et al. |
| 5,316,075 A | 5/1994 | Quon et al. |
| 5,335,143 A | 8/1994 | Maling, Jr. et al. |
| 5,346,745 A | 9/1994 | Bandyopadhyay |
| 5,361,989 A | 11/1994 | Merchat et al. |
| 5,395,592 A | 3/1995 | Bolleman et al. |
| 5,402,312 A | 3/1995 | Kinjo et al. |
| 5,411,208 A | 5/1995 | Burgener |
| 5,419,780 A | 5/1995 | Suski |
| 5,429,302 A | 7/1995 | Abbott |
| 5,437,421 A | 8/1995 | Nosenchuck et al. |
| 5,493,615 A | 2/1996 | Burke et al. |
| 5,516,043 A | 5/1996 | Manna et al. |
| 5,542,176 A * | 8/1996 | Serizawa et al. ............ 165/185 |
| 5,558,156 A | 9/1996 | Tsutsui |
| 5,595,205 A | 1/1997 | Sirovich et al. |
| 5,681,152 A | 10/1997 | Aha |
| 5,758,823 A | 6/1998 | Glezer et al. |
| 5,791,601 A | 8/1998 | Dancila et al. |
| 5,797,414 A | 8/1998 | Sirovich et al. |
| 5,798,465 A | 8/1998 | Ziada et al. |
| 5,857,619 A | 1/1999 | Huang et al. |
| 5,861,703 A | 1/1999 | Losinski |
| 5,873,408 A | 2/1999 | Bellet et al. |
| 5,876,187 A | 3/1999 | Forster et al. |
| 5,881,954 A | 3/1999 | Holm |
| 5,894,990 E | 4/1999 | Glezer et al. |
| 5,901,037 A | 5/1999 | Hamilton et al. |
| 5,921,757 A | 7/1999 | Tsutsui et al. |
| 5,957,413 A | 9/1999 | Glezer et al. |
| 5,983,944 A | 11/1999 | Niv |
| 5,988,522 A | 11/1999 | Glezer et al. |
| 5,996,903 A | 12/1999 | Asai et al. |
| 5,997,671 A | 12/1999 | Takeuchi et al. |
| 6,016,969 A | 1/2000 | Tilton et al. |
| 6,032,464 A | 3/2000 | Swift et al. |
| 6,056,204 A | 5/2000 | Glezer et al. |
| 6,059,020 A | 5/2000 | Jairazbhoy et al. |
| 6,109,222 A | 8/2000 | Glezer et al. |
| 6,123,145 A | 9/2000 | Glezer et al. |
| 6,137,891 A | 10/2000 | Porrazzo et al. |
| 6,186,748 B1 | 2/2001 | Umeda et al. |
| 6,247,525 B1 | 6/2001 | Smith et al. |
| 6,280,148 B1 | 8/2001 | Zengerle et al. |
| 6,315,215 B1 | 11/2001 | Gipson et al. |
| 6,333,852 B1 | 12/2001 | Lin |
| 6,405,794 B1 | 6/2002 | Kim et al. |
| 6,412,732 B1 | 7/2002 | Amitay et al. |
| 6,440,212 B1 | 8/2002 | Hayes |
| 6,451,175 B1 | 9/2002 | Lal |
| 6,457,654 B1 | 10/2002 | Glezer et al. |
| 6,458,618 B1 | 10/2002 | Allen et al. |
| 6,475,658 B1 | 11/2002 | Pedicini et al. |
| 6,481,984 B1 | 11/2002 | Shinohara et al. |
| 6,554,607 B1 | 4/2003 | Glezer et al. |
| 6,588,497 B1 | 7/2003 | Glezer et al. |
| 6,628,522 B2 | 9/2003 | Trautman et al. |
| 6,629,425 B2 | 10/2003 | Vaiyapuri |
| 6,631,077 B2 | 10/2003 | Zuo |
| 6,644,598 B2 | 11/2003 | Glezer et al. |
| 6,650,542 B1 | 11/2003 | Chrysler et al. |
| 6,668,911 B2 | 12/2003 | Bingler |
| 6,669,115 B2 | 12/2003 | Sun et al. |
| 6,722,581 B2 | 4/2004 | Saddoughi |
| 6,725,670 B2 | 4/2004 | Smith et al. |
| 6,759,159 B1 | 7/2004 | Gray et al. |
| 6,801,430 B1 | 10/2004 | Pokharna |
| 6,809,928 B2 | 10/2004 | Gwin et al. |
| 6,817,204 B2 | 11/2004 | Bash et al. |
| 6,824,915 B1 | 11/2004 | Pedicini |
| 6,843,310 B1 | 1/2005 | Chen |
| 6,848,631 B2 | 2/2005 | Monson et al. |
| 6,937,472 B2 | 8/2005 | Pokharna |
| 6,988,706 B2 | 1/2006 | Seeley et al. |
| 7,023,697 B2 | 4/2006 | Pokharna et al. |
| 7,039,213 B2 | 5/2006 | Hyre et al. |
| 7,055,329 B2 | 6/2006 | Martens et al. |
| 7,092,254 B1 | 8/2006 | Monsef et al. |
| 2001/0037875 A1* | 11/2001 | Guerrero ................. 165/80.3 |
| 2002/0056908 A1* | 5/2002 | Brownell et al. ............ 257/714 |
| 2002/0080582 A1* | 6/2002 | Chang ...................... 361/700 |
| 2002/0098097 A1 | 7/2002 | Singh |
| 2003/0043531 A1 | 3/2003 | Trautman et al. |
| 2003/0066628 A1* | 4/2003 | Mochizuki et al. ...... 165/104.26 |
| 2003/0075615 A1 | 4/2003 | Saddoughi |
| 2003/0110788 A1 | 6/2003 | Koeneman et al. |
| 2003/0133587 A1 | 7/2003 | Hyre et al. |
| 2003/0177899 A1 | 9/2003 | Monson et al. |
| 2004/0125561 A1 | 7/2004 | Gwin et al. |
| 2004/0231341 A1 | 11/2004 | Smith |
| 2005/0013116 A1 | 1/2005 | Pokharna et al. |
| 2005/0031137 A1 | 2/2005 | Browning et al. |
| 2005/0074662 A1 | 4/2005 | Cho et al. |
| 2005/0105757 A1 | 5/2005 | Tummire et al. |
| 2005/0111185 A1 | 5/2005 | Bhattacharya et al. |
| 2005/0121171 A1* | 6/2005 | Mukasa et al. ............ 165/80.3 |
| 2005/0163338 A1 | 7/2005 | Ohashi |
| 2005/0284612 A1 | 12/2005 | Machiroutu |
| 2006/0016581 A1 | 1/2006 | Wang et al. |
| 2006/0022092 A1 | 2/2006 | Miller et al. |
| 2006/0145027 A1 | 7/2006 | Warsop et al. |
| 2006/0164805 A1 | 7/2006 | Meinders et al. |

FOREIGN PATENT DOCUMENTS

| | | |
|---|---|---|
| JP | 10-047254 | 2/1998 |
| JP | 2001-355574 | 12/2001 |
| JP | 2005-264811 | 9/2005 |
| SU | 1274165 A1 | 1/1984 |
| WO | WO 99/26457 | 11/1998 |

| WO | WO 02/72421 | 3/2002 |
| WO | WO 2005/008348 | 7/2004 |
| WO | WO 2005/090789 | 2/2005 |

OTHER PUBLICATIONS

Manger, Daniela L., "A sound transducer with a flat, flexible diaphragm working with bending waves"; Manger Products, Mellrichstadt, Germany; 4 pages.

Flomerics May 1998 Article 3.htm; Electronics Cooling; Thermal management of handheld telecommunication products; www.electronics-cooling.com/Resources/EC_Articles/May98/article3.htm; Mar. 24, 2005; 7 pages.

Georgia Institute of Technology, Package Research Center; e-newsletter, vol. 1, Issue 6, Dec. 2004; "Single Phase Pumped Flow Loop with a Stacked Microchannel Heat Sink"; www.prc.gatech.edu/newsletter/dec2004.htm; Jul. 16, 2005; 9 pages.

Toon, John, GT Research Horizons, Winter 2004; "Keeping Cool, Synthetic jet and droplet atomization technologies meet broad range of electronic thermal management needs"; http://gtresearchnews.gatech.edu/reshor/rh-w04/fluidics.html; Aug. 4, 2005; 4 pages.

Heffington, S. and Glezer, A., "Enhanced Boiling Heat Transfer by Submerged Ultrasonic Vibrations"; George W. Woodruff School of Mechanical Engineering, Georgia Institute of Technology, Atlanta, Georgia; Sep. 29-Oct. 1, 2004; 5 pages.

Harris, Tom, "How Speakers Work"; How Stuff Works; http://electronics.howstuffworks.com/speaker.htm; May 17, 2006, 31 pages.

Arik, Mehmet, White Paper, "Local Heat Transfer Coefficients of a High Frequency Synthetic Jet During Impingement Cooling Over Flat Surfaces"; GE Global Research Ctr., 19 pgs.

Innovative Techniques to Obtain Heat Transfer Coefficient and Film Effectiveness; Design Considerations for Rugged Enclosures; http://www.afrlhorizons.com/ETB/ETBriefs/Oct05; Dec. 9, 2005; 4 pages.

InTech, ISA-The Instrumentation, Systems, and Automation Society; "Synthetic jet, atomization keep it cool"; Dec. 3, 2003; www.isa.org/InTechTemplate.cfm Aug. 4, 2005; 2 pgs.

Bash, Cullen E et al.; "Acoustic Compression for theThermal Management of Multi-Load Electronic Systems"; White Paper; Hewlett-Packard Laboratories; 8 pages.

Wang, Evelyn N. et al.; "Micromachined Jets for Liquid Impingement Cooling of VLSI Chips"; Journal of Microelectromechanical Systems, vol. 13, No. 5, Oct. 2004; 10 pages.

Linderman, Ryan J. et al., "The Resonant Micro Fan For Fluidic Transport, Mixing and Particle Filtering"; Proceedings of 2001 ASME International Mechanica Engineering Congress and Exposition, Nov. 11-16, 2001, New York, NY; 8 pages.

Suzuki, Hiroaki et al., "Manipulation of a Round Jet with Electromagnetic Flap Actuators"; IEEE MEMS ;99, Orlando, Florida, Jan. 1999; 7 pages.

Ho, Chih-Ming and Tai, Yu-Chong; Micro-Electro-Mechannical-Systems (MEMS) and Fluid Flows; Annu. Rev. Fluid . Mich. 1998, 30:579-612.

Kercher, Dan S. et al.; "Microjet Cooling Devices for Thermal Management of Electronics"; http:/www.utdallas.edu; Mar. 24, 2005, 4 pages.

Li, Shuo and Smith, Marc K.; "Numerical Study of the Micro Synthetic Jet and Its Application to Thermal Management in Microelectronics"; http://www.me.gatech.edu/fluids/projects/smith/li.htm; Sep. 12, 2006; 2 pages.

Nemeth, Jackie; "Microjet Integration, New microjet allows for easy integration into electronic devices"; Research Horizons, http://www.gtresearchnews.gatech.edu/reshor/rh-spr98/mjet.html; Sep. 12, 2006; 2 pages.

Science Daily: Synthetic Jet and Droplet Atomization Technologies Help Electronic Devices Keep Cool; www.sciencedaily.com/releases/2003; Sep. 12, 2006; 4 pages.

Tillery, Steven W. et al.; "Boiling Heat Transfer Enhancement by Submerged, Vigration-Induced Jets"; White paper; George W. Woodruff School of Mech. Engineering; 15 pages.

Daniels, Christopher et al.; "Nonlinear Oscillations and Flow of Gas Within Closed and Open Conical Resonators"; NASA/TM-2004-212902; AIAA-2004-0677; Prepared for the 42nd Aerospace Sciences Meeting and Exhibit; Reno, Nevada, Jan. 5-8, 2004; Feb. 2004; 12 pages.

Davis, Sam; "Turn Down the Heat, Please!"; electronic design; www.elecdesign.com/Articles/Index.cfm; Mar. 17, 2005; 5 pages.

PI Ceramic; "PICA-Stack Piezoceramic Actuators Versatile Piezoelectric Power"; www.piceramic.com; 2006; 3 pages.

* cited by examiner

SYNTHETIC JET HEAT PIPE THERMAL MANAGEMENT SYSTEM

CROSS-REFERENCE TO RELATED APPLICATIONS

The present application claims priority from U.S. Provisional Application Ser. No. 60/736,412 (Glezer et al.), entitled "SYNTHETIC JET HEAT PIPE THERMAL MANAGEMENT SYSTEM", which was filed on Nov. 14, 2005, and which is incorporated herein by reference in its entirety.

FIELD OF THE DISCLOSURE

The present disclosure relates generally to thermal management systems, and more specifically to thermal management systems that utilize synthetic jet actuators in combination with flat heat pipes.

BACKGROUND OF THE DISCLOSURE

As the size of semiconductor devices has continued to shrink and circuit densities have increased accordingly, thermal management of these devices has become more challenging. In the past, thermal management in semiconductor devices was often addressed through the use of forced convective air cooling, either alone or in conjunction with various heat sink devices, and was accomplished through the use of fans. However, fan-based cooling systems are undesirable due to the electromagnetic interference and noise attendant to their use. Moreover, the use of fans also requires relatively large moving parts, and corresponding high power inputs, in order to achieve the desired level of heat transfer. Furthermore, while fans are adequate for providing global movement of air over electronic devices, they generally provide insufficient localized cooling to provide adequate heat dissipation for the hot spots that typically exist in a semiconductor device.

More recently, thermal management systems have been developed which utilize synthetic jet ejectors. These systems are more energy efficient than comparable fan-based systems, and also offer reduced levels of noise and electromagnetic interference. Systems of this type are described in greater detail in U.S. Pat. No. 6,588,497 (Glezer et al.). The use of synthetic jet ejectors has proven very efficient in providing localized heat dissipation, and hence can be used to address hot spots in semiconductor devices. Synthetic jet ejectors may be used in conjunction with fan-based systems to provide thermal management systems that afford both global and localized heat dissipation.

One example of a thermal management system that utilizes synthetic jet ejectors is illustrated in FIG. 1. The system shown therein utilizes an air-cooled heat transfer module 101 which is based on a ducted heat ejector (DHE) concept. The module utilizes a thermally conductive, high aspect ratio duct 103 that is thermally coupled to one or more IC packages 105. Heat is removed from the IC packages 105 by thermal conduction into the duct shell 107, where it is subsequently transferred to the air moving through the duct. The air flow within the duct 103 is induced through internal forced convection by a pair of low form factor synthetic jet ejectors 109 which are integrated into the duct shell 107. In addition to inducing air flow, the turbulent jet produced by the synthetic jet ejector 109 enables highly efficient convective heat transfer and heat transport at low volume flow rates through small scale motions near the heated surfaces, while also inducing vigorous mixing of the core flow within the duct.

Thermal management systems are also known which are based on heat pipes. Heat pipes are devices that can quickly transfer heat from one point to another with almost no heat loss. A typical heat pipe consists of a sealed aluminum or copper container whose inner surfaces have a capillary wicking material disposed thereon. Heat pipes have the ability to transport heat against gravity by an evaporation-condensation cycle with the help of porous capillaries that form the wicking material. The wick provides the capillary driving force which returns the condensate to the evaporator.

FIG. 2 shows a specific example of one known heat pipe. As shown therein, the device 151 includes a coolant storing part 153 for storing a liquid coolant, and a heat absorbing part 155 that is adapted to absorb heat from a heat source and that includes at least one micro channel 157. The heat absorbing part 155 is positioned close to the heat source and is in liquid communication with the coolant storing part 153. The liquid coolant is partly filled in the micro-channel 157 by surface tension where it is vaporized to become a gaseous coolant when heat is absorbed from the heat generating source. The device 151 includes a heat insulating part 159 positioned adjacent to the heat absorbing part 155 to prevent the heat absorbed by the heat absorbing part 155 from transferring to other zones. The device 151 also includes a condensing part 161, positioned apart from the heat absorbing part, for condensing the gaseous coolant. The device 151 is also equipped with a gas moving part 163 positioned near the heat absorbing part 155 and the condensing part 161. The gas moving part 163 includes a passage through which the gaseous coolant moves from the heat absorbing part 155 to the condensing part 161. The device 151 further includes a housing 165 in which at least the heat absorbing part is housed.

While the above noted systems represent notable improvements in the art, the need still exists for thermal management systems that have improved heat transfer efficiencies. This need, and other needs, are met by the devices and methodologies disclosed herein.

SUMMARY OF THE DISCLOSURE

In one aspect, a thermal management system is provided which comprises a first heat spreader comprising a heat pipe material, a plurality of fins disposed on said first heat spreader, and a synthetic jet actuator adapted to direct a synthetic jet between at least a pair of said plurality of fins.

In another aspect, a method for dissipating heat from a heat source is provided. In accordance with the method, the heat source is placed into thermal contact with a heat pipe such that heat is transported from a first location proximal to the heat source to a second location removed from the heat source. The heat is then dissipated at the second location through the use of a synthetic jet actuator.

These and other aspects of the present disclosure are described in greater detail below.

DETAILED DESCRIPTION

It has now been found that the aforementioned needs may be met through the use of synthetic jet actuators in combination with heat pipe constructions to provide a variety of highly efficient and useful thermal management systems. These systems offer a high degree of design flexibility, and permit heat dissipation to occur at a location remote from the heat source.

Figure 3:
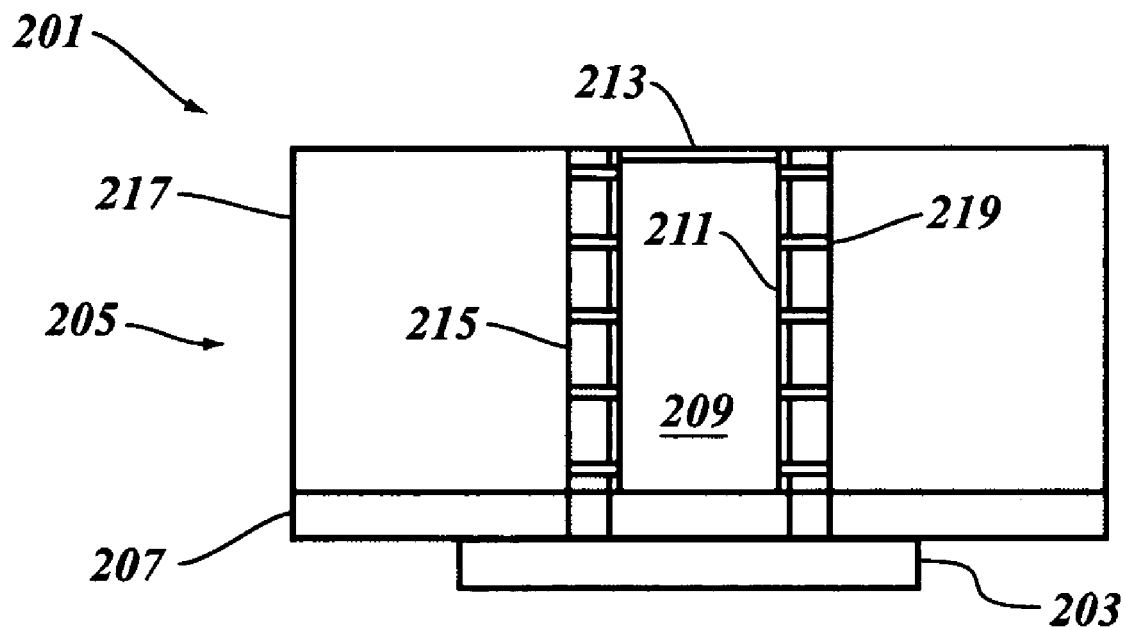
FIG. 3 is an illustration (side view) of an embodiment of a thermal management system made in accordance with the teachings herein.
Figure 4:
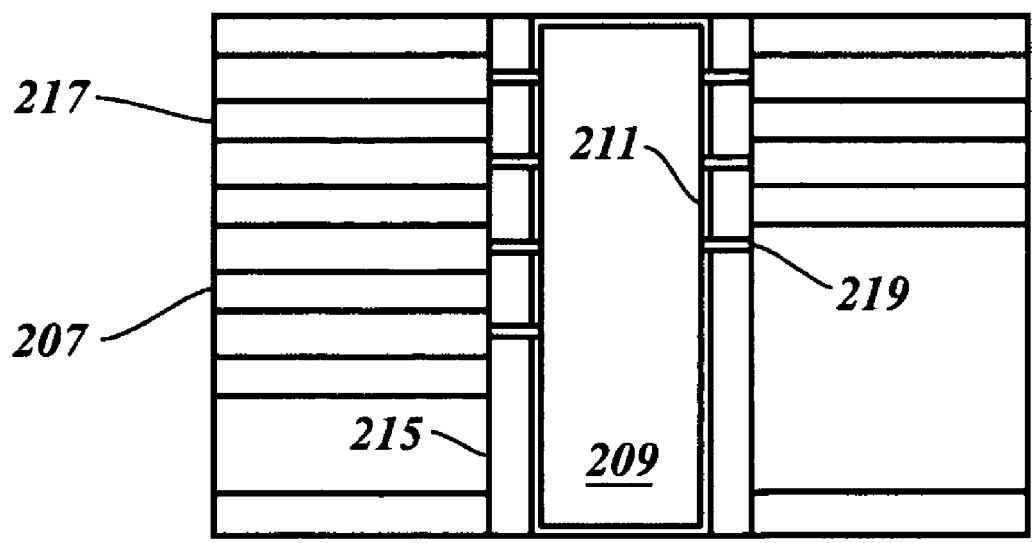
FIG. 4 is an illustration (top view) of the embodiment of FIG. 3.

A first particular, non-limiting embodiment of a thermal management system of the type disclosed herein is illustrated in FIGS. 3-4. The system 201 depicted therein comprises a heat source 203 (see FIG. 3) which is to be thermally managed. In this particular embodiment, the heat source 203 is a semiconductor die, although one skilled in the art will appreciate that the heat source 203 could also be a PCB, an electronic component, a data storage device, or various other types of heat sources as are known to the art.

The heat source 203 is in thermal contact with a rectangular heat exchanger 205 by way of a first heat spreader 207. The first heat spreader 207 preferably comprises a heat pipe material, but may also be of a solid metal construction. The heat exchanger 205 comprises a central synthetic jet actuator module 209 which houses a synthetic jet actuator. A second heat spreader 215 is wrapped around the exterior of the central actuator module 209. A plurality of thermally conductive heat fins 217 extend from the second heat spreader 215. For simplicity of illustration, the details of the central synthetic jet actuator module have been omitted. However, synthetic jet actuators that may be adapted for this purpose are known to the art and described, for example, in U.S. Pat. No. 6,588,497 (Glezer et al.), which is incorporated herein by reference in its entirety.

Figure 5:
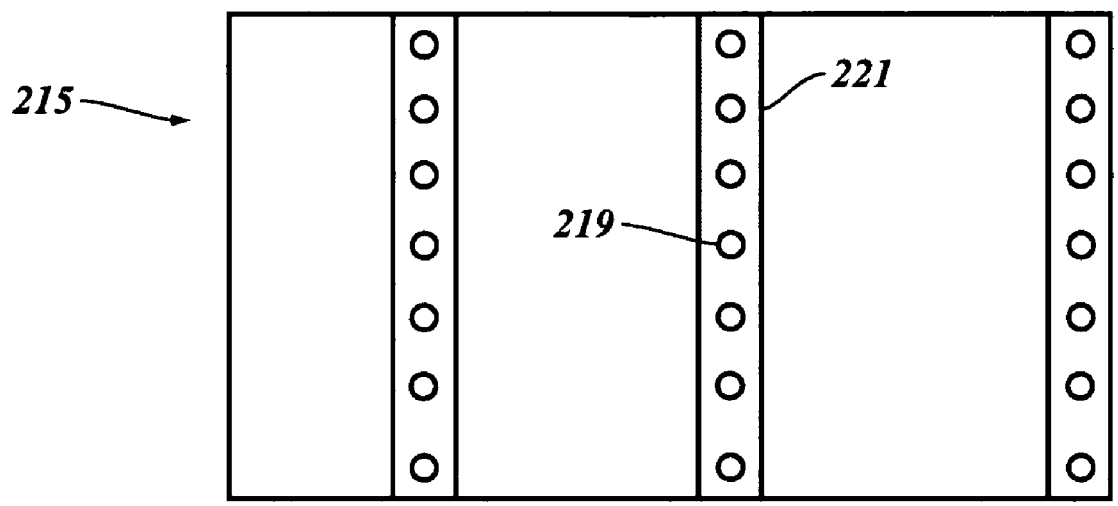
FIG. 5 is an illustration of one example of a flat heat pipe material that can be wrapped around a synthetic jet actuator module in some of the embodiments of thermal management systems described herein.

The heat exchanger 205 is equipped with a plurality of jet orifices 219 which are in open communication with the interior of the synthetic jet actuator module 209 and which extend through the jet actuator module 209 and the second heat spreader 215. Each of these jet orifices 219 is adapted to direct a synthetic jet into the space between the fins 217. The manner in which this is accomplished may be appreciated with respect to FIG. 5, which shows a portion of the second heat spreader 215 flattened out into a plane for ease of illustration. As seen therein, the second heat spreader 215 comprises a series of ribs 221 through which the jet orifices 219 extend. The provision of such ribs 221 is advantageous in that they add to the mechanical integrity of the second heat spreader 215. In alternate embodiments, rounded inserts may be provided (either in place of, or in addition to, the ribs) in the second heat spreader 215 through which the jet orifice 219 extends.

When the system 201 is in use, the diaphragm of the synthetic jet actuator within the actuator module 209 is made to vibrate at a desired frequency. This results in the generation of a plurality of synthetic jets at the jet orifices 219. These synthetic jets are preferably directed parallel, and adjacent to, the major planar surfaces of the fins 217.

Figure 6:
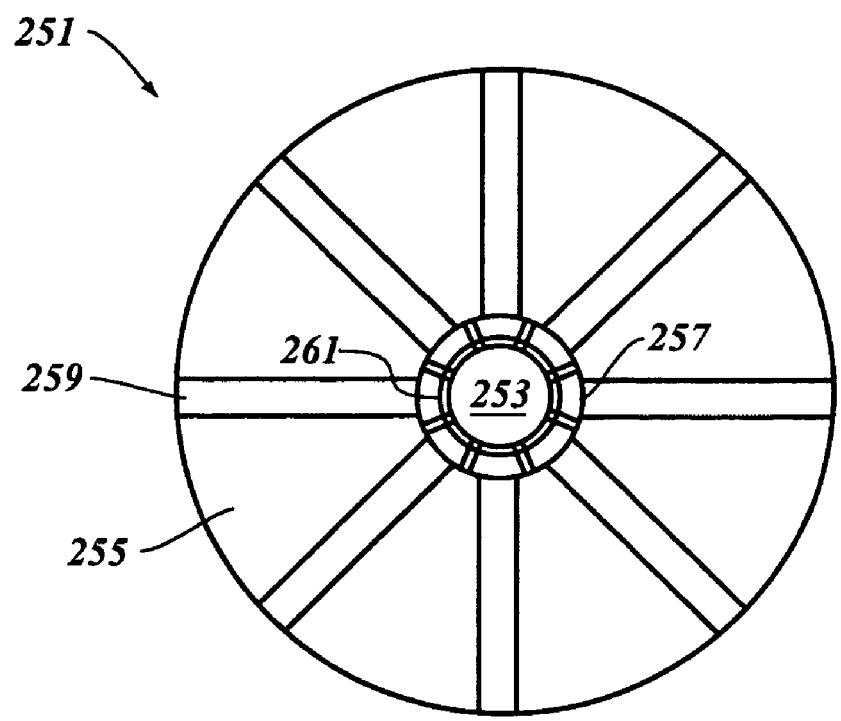
FIG. 6 is an illustration (top view) of another embodiment of a thermal management system made in accordance with the teachings herein.

FIG. 6 illustrates another embodiment of a thermal management system 251 made in accordance with the teachings herein. The thermal management system 251 depicted therein is similar in many respects to the thermal management system 201 depicted in FIGS. 3-4. Thus, the system 251 comprises a central synthetic jet actuator module 253, first 255 and second 257 heat spreaders, and a plurality of thermally conductive heat fins 259 which radiate from the synthetic jet actuator 253. In this embodiment, however, both the wall of the synthetic jet actuator module 253 and the second heat spreader 257 are annular, and the first heat spreader 255 is circular.

Figure 1:
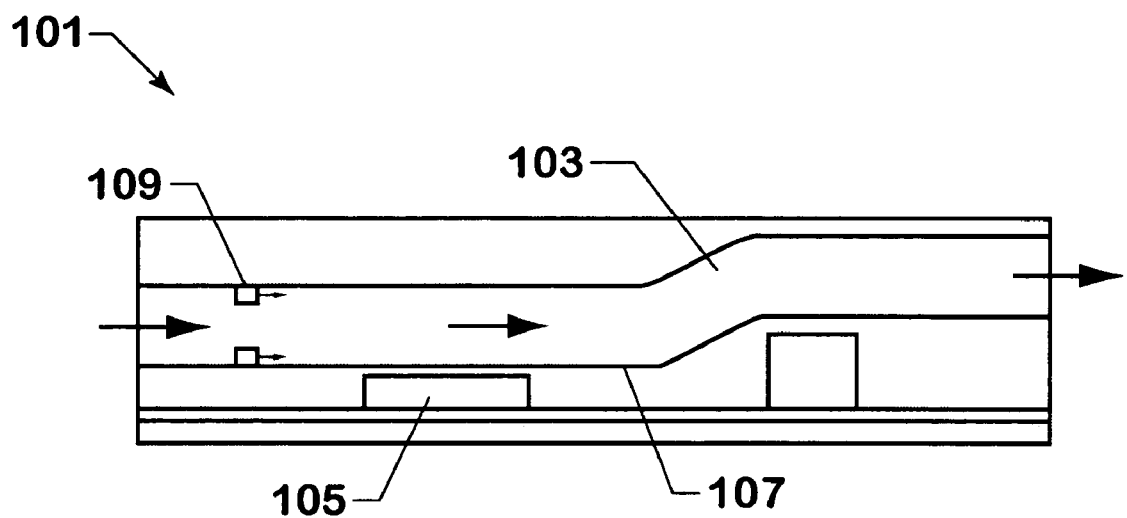
FIG. 1 is an illustration of a prior art thermal management system based on the use of synthetic jet ejectors.
Figure 2:
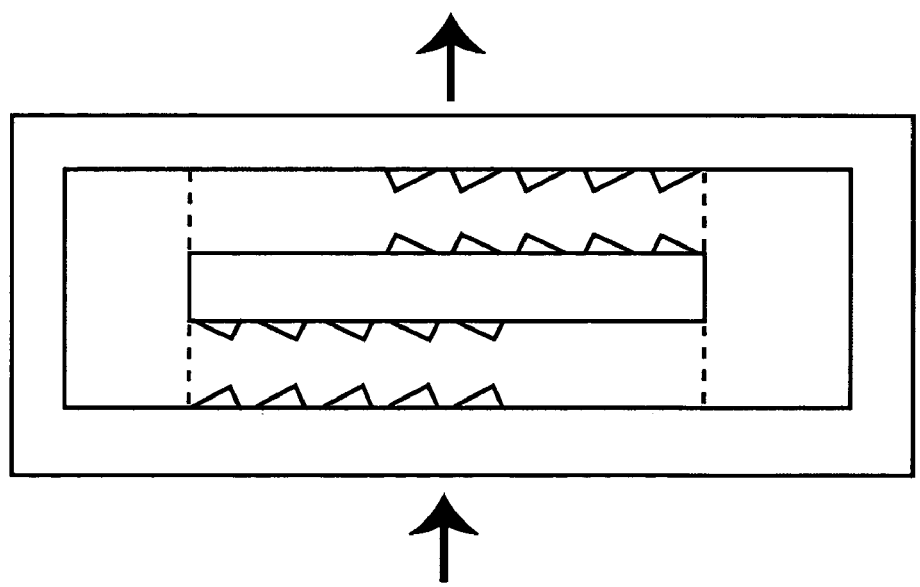
FIG. 2 is an illustration of a prior art thermal management system based on the use of micro-channels.

In the thermal management systems depicted in FIGS. 2-3 and 6, it is preferred that the synthetic jet actuator has sufficient mechanical integrity to support the entire structure, including the first and/or second heat spreader. This permits the use of heat fins (which are preferably heat pipes, but which may also be of a solid construction) that have extremely thin walls and that may be micro-dimensional.

Figure 7:
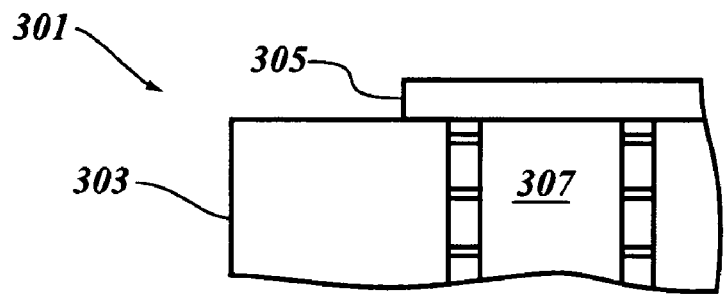
FIG. 7 is an illustration of the use of scaffolding to provide support for a heat fin in a thermal management device made in accordance with the teachings herein.

While the synthetic jet actuator module is useful in providing mechanical support for the heat fins, in some embodiments, as in the thermal management system 301 depicted in FIG. 7, the fins 303 may, in addition, be equipped with scaffolding 305 to provide further support and mechanical integrity. In the particular embodiment depicted, the scaffolding 305 extends over the synthetic jet actuator module 307 and slightly overlaps the fin. It will be appreciated, however, that the scaffolding 305 can span all, or merely a portion of, the length of the fin 303.

Figure 8:
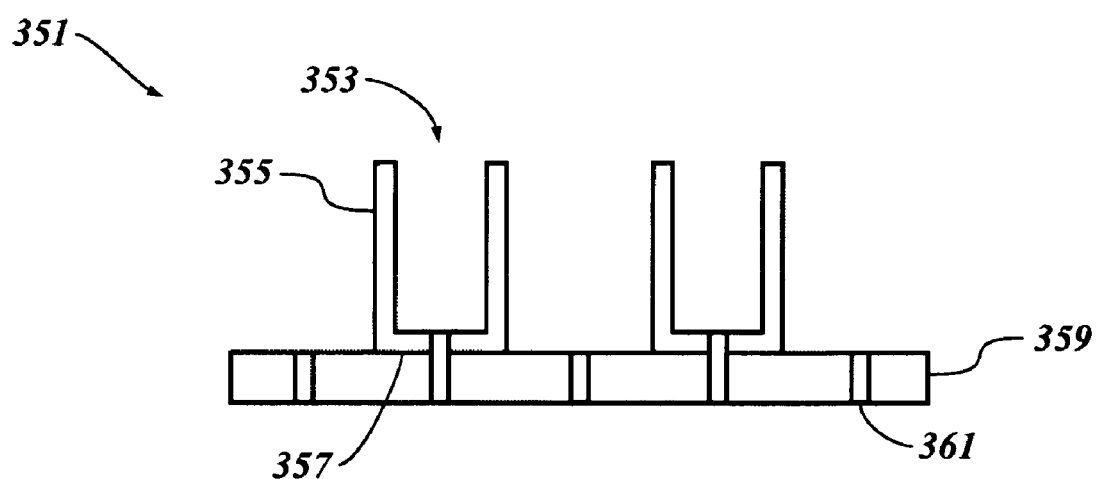
FIG. 8 is an illustration of the use of segmented heat fins in a thermal management device made in accordance with the teachings herein.

While the fins in the thermal management systems described above have been depicted as singular, essentially planar devices, they may also be formed as segments which are then attached to a heat spreader. Such a system is illustrated in FIG. 8. In the thermal management system 351 depicted therein, a plurality of fin modules 353 are provided, wherein each module 353 comprises a pair of fins 355 that are joined by a bottom segment 357. The bottom segment 357, in turn, is mounted to a heat spreader 359. In some embodiments, the bottom segment 357 may be releasably mounted to the heat spreader 359. One or more protrusions, apertures or recesses may be provided in the bottom segment 357 and/or the heat spreader 359 for this purpose. In the particular embodiment depicted, a series of apertures 361 are provided in the heat spreader 359 and in each fin module 353, with the apertures 361 arranged such that a synthetic jet is directed onto or along each side of each fin 355 when the device is in operation.

Various other means may also be used to support the fins in the various thermal management systems described herein. Some examples of such configurations are shown in FIGS. 9-12. In the system 401 illustrated therein, a heat spreader 403 is provided upon which are mounted a plurality of fins 405. A synthetic jet actuator module 407 is provided which is equipped with a series of support grooves 409 that engage the fins 405, thereby locking them in place and providing support for them. The actuator module 407 is also equipped with apertures 411 disposed adjacent to each of the support grooves 409 so that a synthetic jet is directed parallel to the plane of a fin 405 engaged within the support groove 409.

Figure 9:
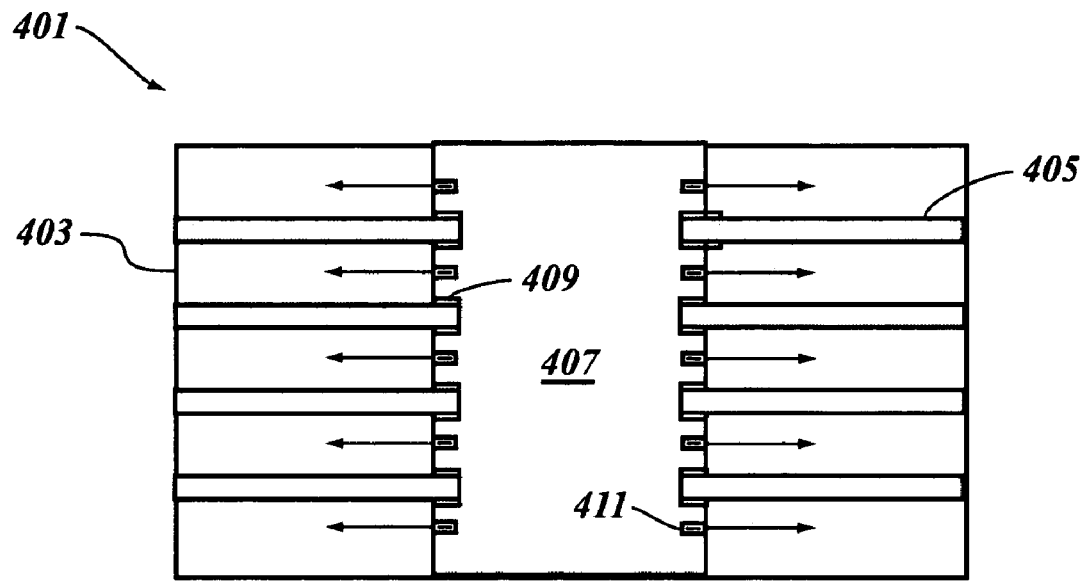
FIG. 9 is an illustration of another embodiment of a thermal management system made in accordance with the teachings herein, wherein the synthetic jet actuator is equipped with a plurality of notches to provide support for the heat fins.
Figure 10:
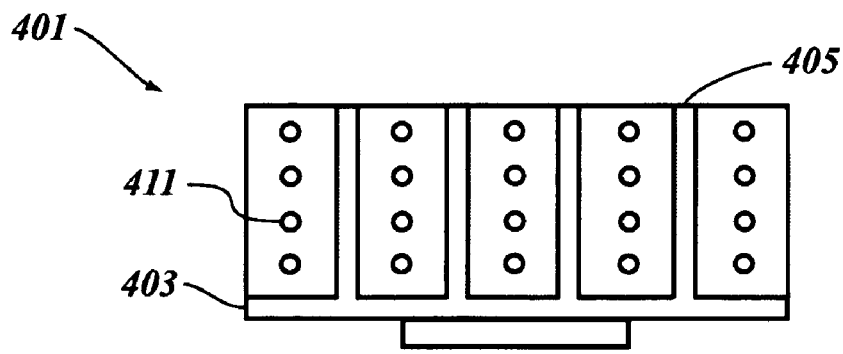
FIG. 10 is a side view of one embodiment of the thermal management system of claim 9.
Figure 11:
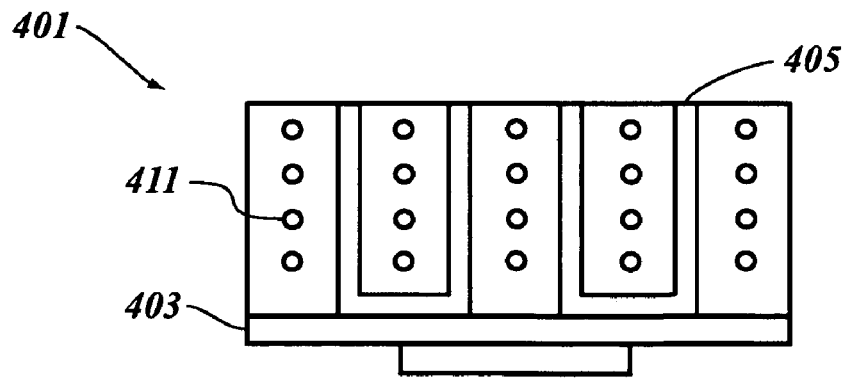
FIG. 11 is a side view of another embodiment of the thermal management system of claim 9.
Figure 12:
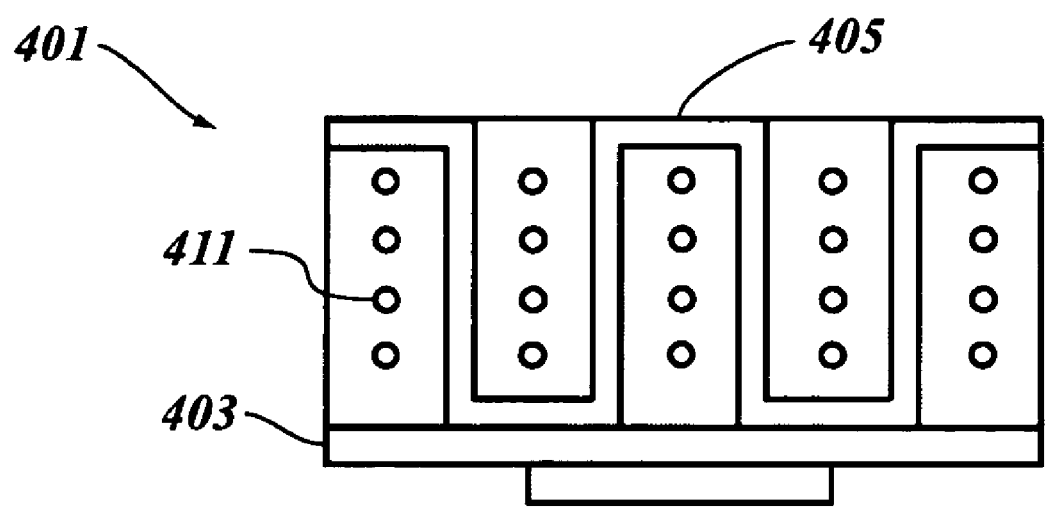
FIG. 12 is a side view of still another embodiment of the thermal management system of claim 9.

FIGS. 10-12 illustrate three different variations in the side view of FIG. 9. In the embodiment depicted in FIG. 10, the fins 405 are integral with the flat heat pipe 403 that defines the first heat spreader. In the embodiment depicted in FIG. 11, the ribs 405 are separate from the first heat spreader 403, and form fin modules similar to those described in reference to FIG. 8. The embodiment illustrated in FIG. 12 is similar to that of FIG. 11, except that the ribs 405 are configured in a square sinusoidal configuration. Such a configuration may be especially desirable in some applications in that it provides additional mechanical support for the fins.

Figure 13:
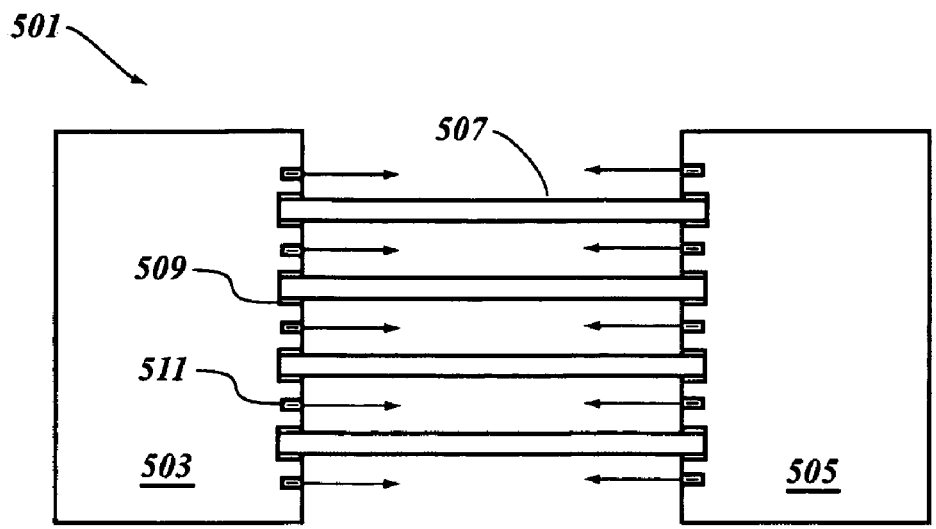
FIG. 13 is an illustration (top view) of another embodiment of a thermal management device made in accordance with the teachings herein.
Figure 14:
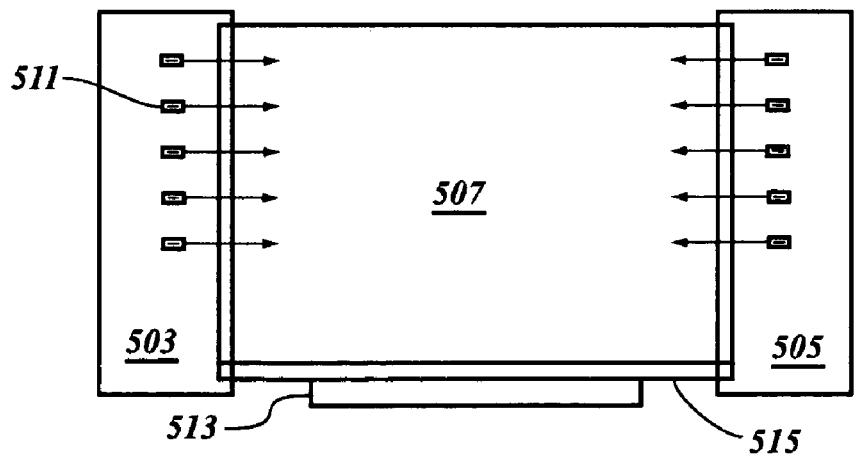
FIG. 14 is a side view of FIG. 13.

FIGS. 13-14 illustrate a further embodiment of the thermal management systems disclosed herein. In the system 501 depicted therein, first 503 and second 505 synthetic jet actuators are provided that support a plurality of fins 507 between them. Each of the first 503 and second 505 synthetic jet actuators is equipped with a series of support grooves 509 that releasably engage the fins 507, thereby locking them in place in the proper orientation and providing support for them. Of course, one skilled in the art will appreciate that embodiments are also possible wherein the fins 507 are permanently attached to the first 503 and second 505 synthetic jet actuators.

As further shown in FIGS. 13-14, the first 503 and second 505 synthetic jet actuators are further equipped with a series of apertures 511 or nozzles that are adapted to direct a synthetic jet along the major surfaces of the fins 507. In the particular embodiment depicted, a set of apertures 511 are provided between each fin 507. The apertures extend vertically along the length of each of the first 503 and second 505 synthetic jet actuators such that a series of essentially parallel synthetic jets are directed parallel and adjacent to each major surface of each fin 507.

As seen in FIG. 14, the bottom of each fin 507 is provided with a heat spreader 513 which is in thermal contact with a die 515 or other heat source that requires thermal management. As in some of the previously described embodiments, a further heat spreader may be disposed about the first 503 and second 505 synthetic jet actuators.

Figure 15:
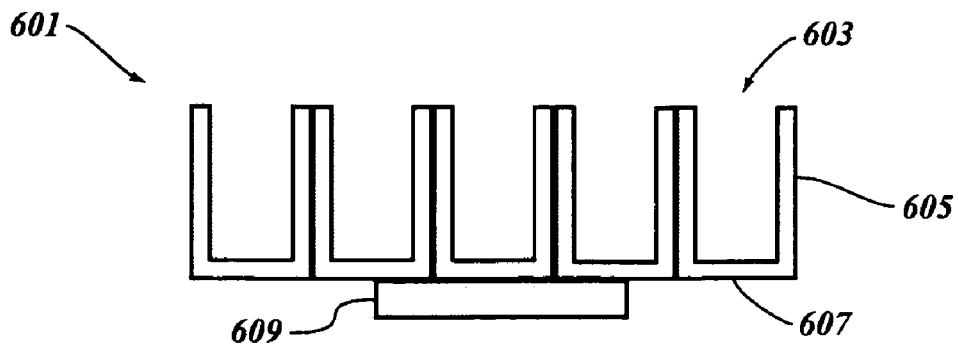
FIG. 15 is an illustration (side view) of another embodiment of a thermal management device made in accordance with the teachings herein.

FIG. 15 illustrates still another thermal management system made in accordance with the teachings herein. In the thermal management system 601 depicted therein, a plurality of fin modules 603 are provided, wherein each module 603 comprises a pair of fins 605 that are joined by a bottom segment 607. Notably, in this embodiment, the need for a heat spreader has been eliminated, and the fin modules 603 may be directly mounted onto a semiconductor die 609 or other heat source.

Figure 16:
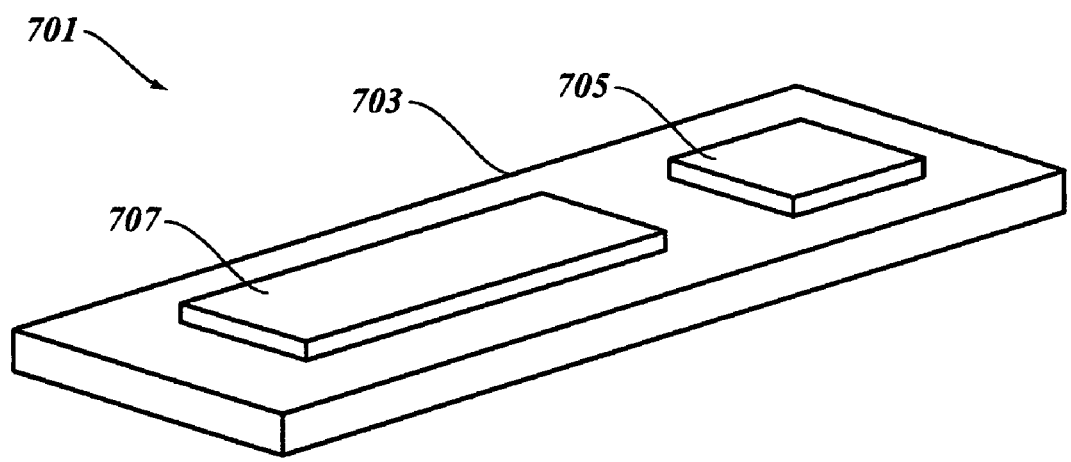
FIG. 16 is a perspective view of a piezoelectric fan made in accordance with the teachings herein.

FIG. 16 illustrates still another thermal management system in accordance with the present teachings. The system 701 disclosed in FIG. 16 comprises a flexible heat pipe 703. A semiconductor die 705 or other device which is to be thermally managed is disposed on a first end of the heat pipe 703. Typically, the first end of the pipe will also be mounted to a substrate or otherwise fixed in position. A piezoelectric sheet 707 is disposed on the opposing second, free end of the heat pipe 703.

In use, the flexible heat pipe 703 efficiently conducts heat from the semiconductor die 705 to the opposing, free end of the heat pipe 703. At the same time, an oscillating voltage is applied to the piezoelectric sheet 707, thereby causing it to expand and contract. This causes the free end of the heat pipe 703 to flap in a dolphin kick-type motion, thereby generating fluid flow and convective heat dissipation. Hence, the heat pipe in this embodiment functions as an active piezoelectric fan.

In alternative embodiments, the system depicted in FIG. 16 may be modified such that the free end of the heat pipe is disposed in a duct. This type of embodiment, which may be referred to as an active reed jet, has the added enhancement of a jet ejector flow. In other embodiments, noise dampening or cancellation techniques may be employed to allow the device to function at an acceptable noise level.

Thermal management systems of the type depicted in FIG. 16 have a number of advantageous properties. Devices of this type have a thin profile, and thus may be used in applications where space is limited. Also, like other heat pipe devices, they offer low resistance heat spreading over long distances. Hence, devices of this type allow heat dissipation to the ambient environment to occur at sizable distances away from the heat source, thus permitting more efficient thermal management. Moreover, devices of this type typically require small power inputs.

A variety of heat pipes may be used in the various devices and methodologies described herein. One preferred type of heat pipe is a thin (e.g., millimeter thick) copper plate in which specially designed micro and/or nano channels have been constructed. A fluidic coolant is placed into the micro and nano channels through a process known as vacuum, charge and sealing (VCS). The copper plate is placed adjacent to the heat source. As heat is generated, the fluidic coolant absorbs the heat in a very short period of time, which preferably induces a phase change in the coolant. Most preferably, the adsorption of heat induces a change in the fluid from a liquid to a vapor phase. The vapor is then rapidly transported through the micro and/or nano channels, and returns to a liquid phase through rapid dissipation of the heat. The liquid coolant then returns to the portion of the heat pipe proximal to the heat source, where the process is repeated. The pressure gradients created by the conversion of the coolant between liquid and vapor states effectively pump the coolant through the micro and/or nano channels as part of a continuous process. Hence, the heat pipe does not require a pump or power source to operate.

In the various embodiments of the devices and methodologies described herein, the fluid utilized by the synthetic jet actuator to provide thermal management is preferably air. One skilled in the art will appreciate, however, that in many embodiments, other gases or liquids may be utilized as the fluid. For example, in some embodiments, especially where the thermal management system is a closed loop system, the use of inert gasses such as nitrogen, argon, helium, or fluorocarbons may be advantageous. In other applications, ambient air may be utilized as the fluid medium, but filters or scrubbers may be provided to remove certain components of the air. In still other embodiments, liquids may be employed as the fluid medium. Such liquids include, but are not limited to, water and various organic liquids, such as, for example, methanol, ethanol, propanol, butanol, and other alcohols; polyethylene glycol, polypropylene glycol, and various other polyols; partially fluorinated or perfluorinated ethers; various dielectric materials; and various mixtures or combinations of the foregoing, including various azeotropic mixtures. Liquid metals (which are generally metal alloys with an amorphous atomic structure) may also be advantageously used in some embodiments of the devices and methodologies described herein.

Various media may also be employed as the coolant in the heat pipes utilized in the devices and methodologies described herein. Most generally, any of the fluid media described above may be used for this purpose, although it is preferred that the fluid media is a liquid when disposed in the heat pipe at room temperature, and undergoes a phase transition to a vapor phase upon the adsorption of heat. One skilled in the art will appreciate that the fluid medium may be disposed in the heat pipe under pressure.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A thermal management system, comprising:
   a first heat spreader comprising a heat pipe;
   a plurality of fins disposed on said first heat spreader;
   a synthetic jet actuator which is centrally disposed with respect to said plurality of fins and which is adapted to direct a synthetic jet between adjacent ones of said plurality of fins; and
   a second heat spreader disposed about the exterior of said synthetic jet actuator.

2. The thermal management system of claim 1, wherein said heat pipe is flat.

3. The thermal management system of claim 1, wherein said second heat spreader is equipped with at least one rib.

4. The thermal management system of claim 3, wherein said rib is equipped with at least one aperture.

5. The thermal management system of claim 4, wherein said synthetic jet actuator is equipped with at least one nozzle, and wherein said aperture is aligned with said nozzle.

6. The thermal management system of claim 4, wherein said rib is equipped with a plurality of apertures, wherein said synthetic jet actuator is equipped with a plurality of nozzles, and wherein each of said plurality of apertures is aligned with one of said plurality of nozzles.

7. The thermal management system of claim 1, wherein said second heat spreader is equipped with a plurality of ribs, and wherein said plurality of ribs extend from said synthetic jet actuator.

8. The thermal management system of claim 1, wherein said synthetic jet actuator is rectangular.

9. The thermal management system of claim 1, wherein said synthetic jet actuator is annular.

10. The thermal management system of claim 1, wherein said synthetic jet actuator is equipped with at least one nozzle, wherein said second heat spreader is equipped with at least one aperture, and wherein said at least one aperture is aligned with said at least one nozzle.

11. The thermal management system of claim 10, wherein said second heat spreader is equipped with a plurality of apertures, wherein said synthetic jet actuator is equipped with a plurality of nozzles, and wherein each of plurality of apertures is aligned with one of said plurality of nozzles.

12. The thermal management system of claim 1, wherein said plurality of fins comprise a thermally conductive material.

13. The thermal management system of claim 1, wherein said plurality of fins are oriented essentially orthogonal to said first heat spreader.

14. The thermal management system of claim 13, wherein said plurality of fins are further equipped with a scaffolding element that extends across said synthetic jet actuator and which provides support for said plurality of fins.

15. The thermal management system of claim 1, wherein said system further comprises at least one fin module mounted on said first heat spreader, wherein said fin module comprises first and second fin elements that extend away from said first heat spreader, and wherein said first and second fin elements are joined together by a third fin element that is oriented essentially parallel to said first heat spreader.

16. The thermal management system of claim 15, wherein said third fin element is equipped with a first aperture, and wherein said synthetic jet actuator is equipped with a first nozzle aligned with said first aperture such that a first synthetic jet is directed between the first and second fin elements when the actuator is operated.

17. The thermal management system of claim 16, wherein said first heat spreader is equipped with second and third apertures oriented adjacent to said first and second fin elements, respectively, and wherein said synthetic jet actuator is equipped with second and third nozzles aligned with said second and third apertures such that second and third synthetic jets are directed along a major surface of said first and second fin elements, respectively, when the actuator is operated.

18. The thermal management system of claim 1, wherein said synthetic jet actuator is equipped with a plurality of notches that engage said plurality of fins.

19. The thermal management system of claim 1, wherein said synthetic jet actuator is equipped with a plurality of notches that engage said fins.

20. The thermal management system of claim 1, wherein said system is further equipped with a square sinusoidal frame that supports said fins.

21. A thermal management system, comprising:
   a first heat spreader which comprises a heat pipe;
   a second heat spreader which is equipped with at least one rib, wherein said at least one rib is equipped with at least one aperture which extends therethrough;
   a fin disposed on said first heat spreader; and
   a synthetic jet actuator which is equipped with a plurality of jet orifices and which is adapted to direct a synthetic jet from one of said plurality of jet orifices and along a major surface of said fin;
   wherein at least one of said at least one apertures is aligned with at least one of said plurality of jet orifices.

* * * * *